(12) United States Patent
Choi et al.

(10) Patent No.: US 8,822,999 B2
(45) Date of Patent: Sep. 2, 2014

(54) ORGANIC LIGHT-EMITTING DISPLAY DEVICE AND METHOD OF MANUFACTURING THE SAME

(75) Inventors: Jong-Hyun Choi, Yongin (KR); Kwang-Hae Kim, Yongin (KR)

(73) Assignee: Samsung Display Co., Ltd. (KR)

( * ) Notice: Subject to any disclaimer, the term of this patent is extended or adjusted under 35 U.S.C. 154(b) by 284 days.

(21) Appl. No.: 13/313,596

(22) Filed: Dec. 7, 2011

(65) Prior Publication Data

US 2013/0026475 A1 Jan. 31, 2013

(30) Foreign Application Priority Data

Jul. 28, 2011 (KR) .................. 10-2011-0075217

(51) Int. Cl.
*H01L 33/42* (2010.01)
*H01L 33/16* (2010.01)
*H01L 33/08* (2010.01)

(52) U.S. Cl.
USPC .......... 257/59; 257/71; 257/40; 257/E33.033; 257/E33.064; 257/E21.158; 438/34; 438/29; 438/149; 438/155; 438/30

(58) Field of Classification Search
CPC .......... H01L 33/42; H01L 33/16; H01L 33/08
USPC ................ 257/59, 71, 40, E33.053, E33.064, 257/E21.158; 438/34, 29, 149, 155, 30, 164
See application file for complete search history.

(56) References Cited

U.S. PATENT DOCUMENTS

| | | | | |
|---|---|---|---|---|
| 5,737,049 A | * | 4/1998 | Shin et al. | 349/122 |
| 6,452,654 B2 | * | 9/2002 | Kubo et al. | 349/114 |
| 7,166,959 B2 | * | 1/2007 | Suzuki et al. | 313/504 |
| 7,649,312 B2 | * | 1/2010 | Saafir et al. | 313/506 |
| 2007/0238227 A1 | * | 10/2007 | Jun et al. | 438/149 |
| 2007/0273800 A1 | * | 11/2007 | Nomura et al. | 349/38 |
| 2009/0141203 A1 | * | 6/2009 | Son et al. | 349/39 |
| 2009/0302332 A1 | * | 12/2009 | Kang et al. | 257/88 |
| 2010/0193790 A1 | * | 8/2010 | Yeo et al. | 257/59 |

FOREIGN PATENT DOCUMENTS

KR 1020080003080 1/2008

* cited by examiner

*Primary Examiner* — Lex Malsawma
*Assistant Examiner* — Sheng Zhu
(74) *Attorney, Agent, or Firm* — Knobbe Martens Olson & Bear LLP

(57) ABSTRACT

An organic light-emitting display device includes a capacitor lower electrode that includes a semiconductor material doped with ion impurities. A first insulating layer covers an active layer and the capacitor lower electrode. A gate electrode includes a gate lower electrode formed of a transparent conductive material and a gate upper electrode formed of metal. A pixel electrode is electrically connected to the thin film transistor. A capacitor upper electrode is at the same level as the pixel electrode. An etch block layer is formed between the first insulating layer and the capacitor upper electrode. Source and drain electrodes are electrically connected to the active layer. A second insulating layer has an opening completely exposing the capacitor upper electrode. A third insulating layer exposes the pixel electrode. An intermediate layer includes an emissive layer. An opposite electrode faces the pixel electrode.

13 Claims, 10 Drawing Sheets

ORGANIC LIGHT-EMITTING DISPLAY DEVICE AND METHOD OF MANUFACTURING THE SAME

CROSS-REFERENCE TO RELATED APPLICATIONS

This application claims the benefit of Korean Patent Application No. 10-2011-0075217, filed on Jul. 28, 2011, in the Korean Intellectual Property Office, the disclosure of which is incorporated herein in its entirety by reference.

BACKGROUND

1. Field

The present disclosure relates to an organic light-emitting display device of which a manufacturing process is simplified and a method of manufacturing the same.

2. Description of the Related Technology

A flat panel display device, such as an organic light-emitting display device or a liquid crystal display device, is fabricated on a substrate having a pattern including a thin film transistor (TFT), a capacitor, an interconnection line for connecting the TFT to the capacitor, and other components. In general, to form a micro pattern including a TFT or the like, a mask having the micro pattern is used to transfer the micro pattern on an array substrate on which a flat panel display device is to be fabricated.

However, in the process of transferring a pattern by using a mask, first, a mask having a corresponding pattern needs to be prepared. Accordingly, the number of mask processes is increased and thus, manufacturing costs for the mask preparation also increase. Moreover, since a complicated process is performed as described above, the manufacturing process is complicated and the manufacturing time increases and thus, manufacturing costs increase.

When a flat panel display device is manufactured by using a lower number of mask processes, various insulating layers, in particular, may overlap during the formation of a capacitor, and thus, signal transmittance by the capacitor may not smoothly occur.

In the process of manufacturing a flat panel display device by using a lower number of mask processes, it is difficult to embody a structure in which a reflective film formed of silver (Ag) is inserted into a pixel electrode to increase light efficiency. Accordingly, there is a need to develop a novel structure for improving light efficiency.

SUMMARY OF CERTAIN INVENTIVE ASPECTS

The present disclosure provides an organic light-emitting display device that enables a manufacturing process therefor to be simplified and has excellent signal transmittance and improved light efficiency, and a method of manufacturing the same.

According to one aspect, there is provided an organic light-emitting display device including a capacitor lower electrode formed on a substrate, the same level as an active layer of a thin film transistor, and including a semiconductor material doped with ion impurities; a first insulating layer formed on the substrate, covering the active layer and the capacitor lower electrode; a gate electrode of the thin film transistor formed on the first insulating layer and including a gate lower electrode formed of a transparent conductive material and a gate upper electrode formed of metal; a pixel electrode formed on the first insulating layer, electrically connected to the thin film transistor, and formed of a transparent conductive material; a capacitor upper electrode disposed at the same level as the pixel electrode and formed of a transparent conductive material; an etch block layer formed between the first insulating layer and the capacitor upper electrode and formed of a transparent conductive material; source and drain electrodes of the thin film transistor electrically connected to the active layer; a second insulating layer formed between the first insulating layer and the source and drain electrodes and having an opening completely exposing the capacitor upper electrode; a third insulating layer formed on the second insulating layer and exposing the pixel electrode; and an intermediate layer disposed on the pixel electrode and including an emissive layer; and an opposite electrode disposed facing the pixel electrode with the intermediate layer there between.

The gap can be formed between a side of the capacitor upper electrode and an inner wall of the opening.

The capacitor lower electrode can be at the same level as an interconnection line connected thereto, and the interconnection line and a connection portion connecting the capacitor lower electrode to the interconnection line may include a semiconductor material doped with the ion impurities.

The connection portion connecting the capacitor lower electrode to the interconnection line can correspond to the gap between the side of the capacitor upper electrode and an inner wall of the opening.

The etch block layer can be disposed corresponding to at least the connection portion.

The gate lower electrode, the pixel electrode, and the capacitor upper electrode are formed of a second transparent conductive material, and the etch block layer can be formed of a first transparent conductive material having etch selectivity with respect to the second transparent conductive material.

The second transparent conductive material can be an amorphous indium tin oxide (a-ITO), and the first transparent conductive material can be crystalloid indium tin oxide (p-ITO).

The intermediate layer can include a first emissive layer for emitting red light, the intermediate layer further can include a first auxiliary layer between the first insulating layer and the first emissive layer.

The first auxiliary layer can include: a first layer that disposed between the pixel electrode and the first emissive layer and allowing holes injected or transported from the pixel electrode to the first emissive layer to pass therethrough; and a second layer disposed between the first insulating layer and the pixel electrode, and formed of the same material used in the etch block layer at the same level.

The intermediate layer can include a second emissive layer for emitting green light, the intermediate layer further can include a second auxiliary layer can have a thickness that is smaller than that of the first auxiliary layer between the first insulating layer and the second emissive layer.

The second auxiliary layer can include a layer that is interposed between the first insulating layer and the pixel electrode, and is formed of the same material used in the etch block layer at the same level.

The intermediate layer can include a third emissive layer for emitting blue light.

The opposite electrode is a reflective electrode that reflects light emitted from the emissive layer.

The intermediate layer can include a first emissive layer for emitting red light, the intermediate layer can be interposed between the pixel electrode and the first emissive layer, and further can include an auxiliary layer that allows holes injected or transported from the pixel electrode to the first emissive layer to pass therethrough, and the pixel electrode is formed of the same crystalloid indium tin oxide (p-ITO) as in the etch block layer at the same level.

According to another aspect, there is provided a method of manufacturing an organic light-emitting display device, wherein the method includes: forming a semiconductor layer on a substrate and patterning the semiconductor layer to form an active layer and a capacitor lower electrode of a thin film transistor; forming a first insulating layer covering the active layer and the capacitor lower electrode on the substrate, and depositing and patterning a transparent conductive material on the first insulating layer to form an etch block layer; sequentially depositing a transparent conductive material and a first metal covering the etch block layer on the first insulating layer and patterning the transparent conductive material and the first metal to form a pixel electrode pattern, and a gate electrode of the thin film transistor, and a capacitor upper electrode pattern simultaneously, each of which includes the transparent conductive material and the first metal are sequentially deposited; forming a second insulating layer covering the pixel electrode pattern, the gate electrode, and the capacitor upper electrode pattern on the first insulating layer, patterning the first insulating layer and the second insulating layer to form contact holes exposing an edge of the active layer, and patterning the second insulating layer to form openings that completely expose the capacitor upper electrode pattern and expose the pixel electrode pattern; depositing a second metal on the second insulating layer, patterning the second metal to form source and drain electrodes electrically connected to the active layer, and removing the first metal to form a pixel electrode and a capacitor upper electrode; and forming a third insulating layer covering the pixel electrode and an opening exposing the pixel electrode in the second insulating layer.

The semiconductor layer can be patterned to form the interconnection line connected to the capacitor lower electrode, at the same level as the capacitor lower electrode, when the capacitor lower electrode is formed.

The transparent conductive material can be patterned to form an auxiliary layer disposed corresponding to the pixel electrode, at the same level as the etch block layer, when the etch block layer can be formed.

The method can further include annealing the transparent conductive material that constitutes the etch block layer to convert the transparent conductive material into crystalloid indium tin oxide (p-ITO).

The edge of the active layer and the interconnection line can be doped with ion impurities.

A gap can be formed between a side of the capacitor upper electrode and an inner wall of the opening that completely exposes the capacitor upper electrode.

The capacitor lower electrode can be doped with ion impurities.

An intermediate layer can include an emissive layer, and an opposite electrode are formed on the pixel electrode.

The intermediate layer can include a layer that is interposed between the pixel electrode and the emissive layer, and allows holes injected or transported from the pixel electrode to the emissive layer to pass therethrough.

According to another aspect of the present invention, there is provided a method of manufacturing an organic light-emitting display device, wherein the method includes: performing a first mask process by forming a semiconductor layer on a substrate and patterning the semiconductor layer to form an active layer and a capacitor lower electrode of a thin film transistor; performing a second mask process by forming a first insulating layer may cover the active layer and the capacitor lower electrode on the substrate, and depositing and patterning a transparent conductive material on the first insulating layer to form an etch block layer and a pixel electrode; performing a third mask process by sequentially depositing a transparent conductive material and a first metal covering the etch block layer and the pixel electrode on the first insulating layer and patterning the transparent conductive material and the first metal to form a gate electrode of the thin film transistor and a capacitor upper electrode pattern simultaneously, each of which includes the transparent conductive material and the first metal are sequentially deposited; performing a fourth mask process by forming a second insulating layer covering the gate electrode and the capacitor upper electrode pattern on the first insulating layer, patterning the first insulating layer and the second insulating layer to form contact holes exposing an edge of the active layer and an opening exposing the pixel electrode, and patterning the second insulating layer to form an opening that completely exposes the capacitor upper electrode pattern; performing a fifth mask process by depositing a second metal on the second insulating layer, patterning the second metal to form source and drain electrodes electrically connected to the active layer, and removing the first metal to form a capacitor upper electrode; and performing a sixth mask process by forming a third insulating layer can cover the pixel electrode and an opening exposing the pixel electrode in the second insulating layer.

The method can further include annealing the transparent conductive material that constitutes the etch block layer and the pixel electrode to convert the transparent conductive material into a crystalloid indium tin oxide (p-ITO).

BRIEF DESCRIPTION OF THE DRAWINGS

The above and other features and advantages will become more apparent by describing in detail certain embodiments with reference to the attached drawings in which.

DETAILED DESCRIPTION OF CERTAIN INVENTIVE EMBODIMENTS

Figure 1:
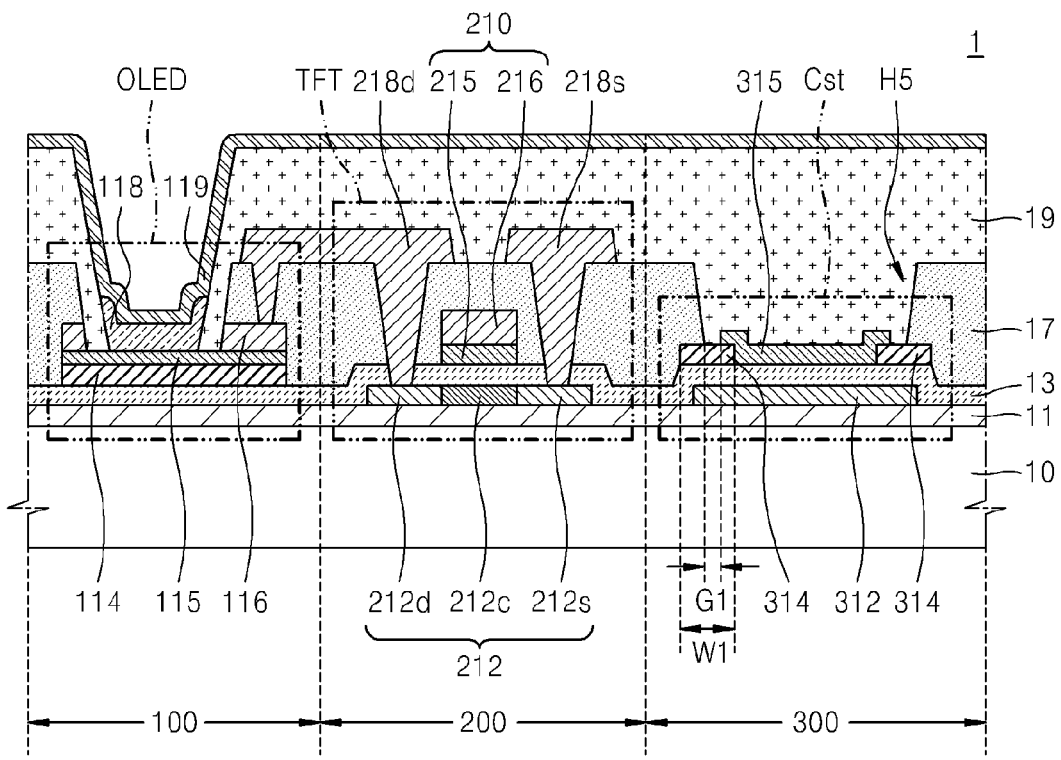
FIG. 1 is a schematic cross-sectional view of an embodiment of an organic light-emitting display device.

Reference will now be made in detail to embodiments, some of which are illustrated in the accompanying drawings, wherein like reference numerals generally refer to like elements throughout. Some embodiments may have different forms and should not be construed as being limited to the descriptions set forth herein. Accordingly, the embodiments are merely described below, by referring to the figures, to explain aspects of the present description. In the current disclosure, if a detailed description of an aspect is considered to make features unclear, it will not be presented herein.

It will be understood that although the terms 'first' and 'second' are used herein to describe various elements, these elements should not be limited by these terms. These terms are only used to distinguish one element from another element.

The terminology used herein is for the purpose of describing embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Hereinafter, certain embodiments of the present invention will be described in detail with reference to the attached drawings.

FIG. 1 is a schematic cross-sectional view of an embodiment of an organic light-emitting display device.

Referring to FIG. 1, the organic light-emitting display device 1 includes a light emission region 100 including an organic light-emitting device OLED, a thin film transistor region 200 including at least one of thin film transistor TFT, and a storage region 300 including a capacitor Cst.

The thin film transistor region 200 includes at least one of thin film transistor TFT. The thin film transistor TFT may include a driving thin film transistor TFT that is electrically connected to the organic light-emitting device OLED and supplies a current thereto, a switching thin film transistor TFT that is electrically connected to, for example, the capacitor Cst. The thin film transistor TFT includes an active layer 212, a gate electrode 210, and source and drain electrodes 218s and 218d. The gate electrode 210 includes a gate lower electrode 215 and a gate upper electrode 216. In some embodiments, the gate lower electrode 215 may be formed of a transparent conductive oxide (TCO). The gate upper electrode 216 may be formed of a low-resistance metal. A first insulating layer 13 may be interposed between the gate electrode 210 and the active layer 212 as a gate insulating layer for insulating the gate electrode 210 from the active layer 212. The active layer 212 may be formed of a semiconductor material. The active layer 212 includes source and drain regions 212s and 212d doped with high concentration ion impurities at opposite edges thereof and a channel region 212c interposed therebetween. The source and drain regions 212s and 212d are electrically connected to source and drain electrodes 218s and 218d, respectively. The thin film transistor TFT illustrated in FIG. 1 is a top gate type thin film transistor TFT. However, the thin film transistor TFT in other embodiments is not limited thereto, and for example, a bottom gate type thin film transistor can also be used.

The storage region 300 includes the capacitor Cst. The capacitor Cst charges a signal applied to the driving thin film transistor TFT even after the switching thin film transistor TFT is turned off. The capacitor Cst includes a capacitor lower electrode 312, a capacitor upper electrode 315, and the first insulating layer 13 as a dielectric layer interposed between the capacitor lower electrode 312 and the capacitor upper electrode 315. The capacitor lower electrode 312 may be at the same level as the active layer 212. The capacitor lower electrode 312 may be formed of a semiconductor material and may have improved electrical conductivity due to the doping with ion impurities. Also, the capacitor upper electrode 315 may be formed of the same transparent conductive material used in the gate lower electrode 215 at the same level.

According to some embodiments, an etch block layer 314 may be formed between the first insulating layer 13 and the capacitor upper electrode 315. Due to the etch block layer 314, when a second insulating layer 17 is etched to form a gap between a side of the capacitor upper electrode 315 and an inner wall of a fifth opening H5, the first insulating layer 13 disposed under the second insulating layer 17 is not affected thereby.

The second insulating layer 17 is formed on the capacitor upper electrode 315, and the fifth opening H5 is formed in the second insulating layer 17 to completely expose the capacitor upper electrode 315. In some embodiments, the gap G1 is formed between the side of the capacitor upper electrode 315 and the inner wall of the fifth opening H5. In forming the gap G1, when the second insulating layer 17 is etched, the first insulating layer 13 disposed under the second insulating layer 17 may be affected by an etchant and an etch method. For example, the first insulating layer 13 may be over-etched and thus, an undercut may occur.

If the first insulating layer 13 is over-etched, the capacitor lower electrode 312 disposed under the first insulating layer 13 may be exposed. The capacitor lower electrode 312 including a semiconductor material such as polycrystal silicon may, when a metal layer formed on the capacitor upper electrode 315 is removed, chemically react with a metal component generated from the etching using an etchant to form metal silicide. The metal silicide may generate a leakage current of a capacitor. However, according to some embodiments, due to the etch block layer 314, the problem described above is prevented.

Figure 2:
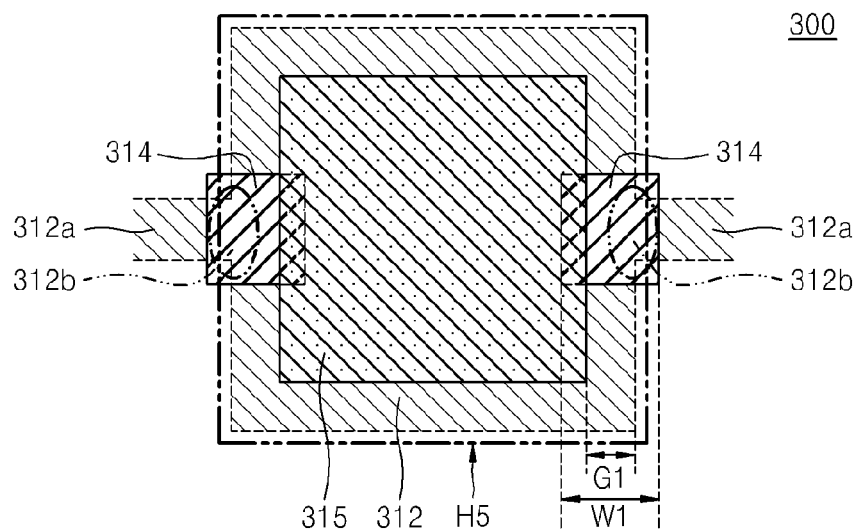
FIGS. 2 and 3 are respectively a plan view and a cross-sectional view of a storage region of the embodiment of an organic light-emitting display device.
Figure 3:
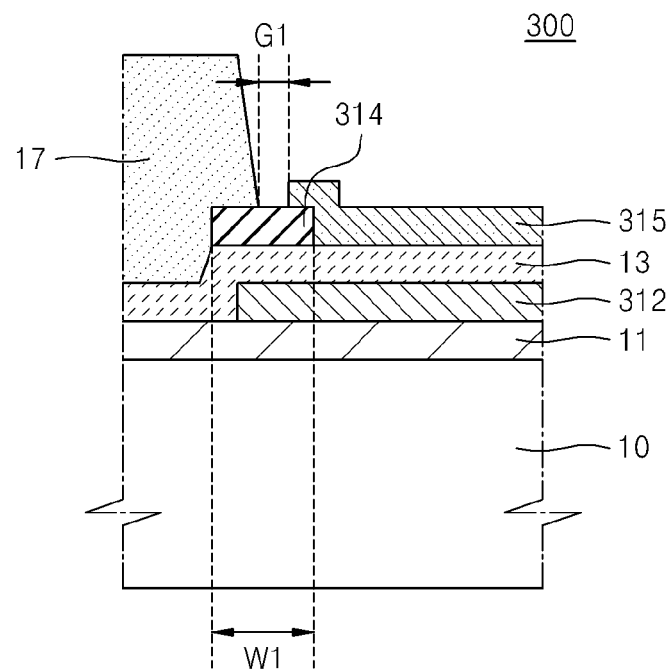

FIGS. 2 and 3 are respectively a plan view and a cross-sectional view of the storage region 300 of the embodiment of an organic light-emitting display device 1.

Referring to FIGS. 2 and 3, the second insulating layer 17 has the fifth opening H5 that completely exposes the capacitor upper electrode 315, and the gap G1 is formed between the side of the capacitor upper electrode 315 and the side of the fifth opening H5.

An interconnection line 312a may extend from the capacitor lower electrode 312. The interconnection line 312a may be formed of the same material used in the capacitor lower electrode 312 at the same level. The capacitor lower electrode 312, the interconnection line 312a, and a connection portion 312b that connects the capacitor lower electrode 312 to the interconnection line 312a can each be formed of a semiconductor material that is doped with ion impurities to embody high electrical conductivity.

The ion impurities-doped region of each of the capacitor lower electrode 312 and the interconnection line 312a connected to the capacitor lower electrode 312 can be dependent upon a region occupied by the fifth opening H5 formed in the second insulating layer 17. This will be described in detail below. If the fifth opening H5 exposes only a portion of the capacitor upper electrode 315, an edge of a semiconductor layer that constitutes the capacitor lower electrode 312 and the connection portion 312b between the capacitor lower electrode 312 and the interconnection line 312a may not be doped with ion impurities. The capacity of the capacitor Cst can decrease or a signal transmittance quality may deteriorate.

However, in some embodiments, the fifth opening H5 completely exposes the capacitor upper electrode 315, and the capacitor lower electrode 312 and the interconnection line 312a can all be doped with ion impurities. In particular, since the connection portion 312b connecting the capacitor lower electrode 312 to the interconnection line 312a is disposed corresponding to the gap G1 between the side of the capacitor upper electrode 315 and the inner wall of the fifth opening H5, the connection portion 312b may also be doped with ion impurities. Accordingly, all of the capacitor lower electrode 312, the interconnection line 312a, and the connection portion 312b are completely doped with ion impurities, an electrostatic capacity may increase and a signal transmittance quality may increase. In particular, since the connection portion 312b corresponds to an inlet through which a signal transmitted via the interconnection line 312a is applied to the capacitor Cst, if not doped with ion impurities, a signal transmittance quality may decrease. Accordingly, in some embodiments, the connection portion 312b is disposed corresponding to the gap G1 and this disposition enables the connection portion 312b to be easily doped with ion impurities.

In some embodiments, as illustrated in FIG. 2, the etch block layer 314 is formed corresponding to at least the connection portion 312b connecting the capacitor lower electrode 312 to the interconnection line 312a.

Figure 4:
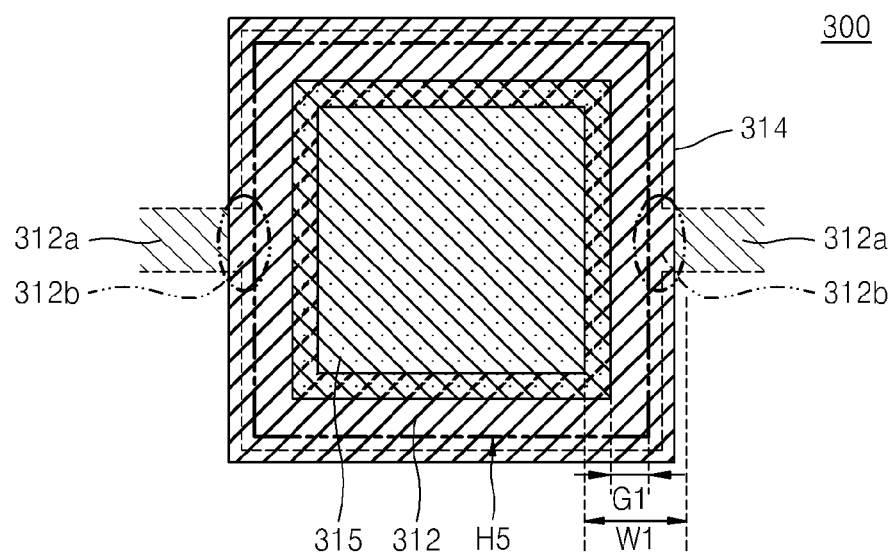
FIG. 4 is a schematic plan view of a storage region of the embodiment of an organic light-emitting display device.

FIG. 4 is a schematic plan view of the storage region 300 of another embodiment of the organic light-emitting display device. Referring to FIG. 4, the etch block layer 314 is formed covering, in addition to the connection portion 312b, a region corresponding to the gap G1. In FIG. 4, the etch block layer 314 is formed as a closed loop and can protect a portion of the first insulating layer 13 that may be exposed by the gap G1. A cross-sectional view of the storage region 300 of FIG. 4 is the same as that of FIG. 3.

As described above, the etch block layer 314 prevents over-etching of the first insulating layer 13. Since a width W1 of the etch block layer 314 is greater than the gap G1, even when isotropic etching or anisotropic etching occurs, a portion of the first insulating layer 13 corresponding to the gap G1 is protected.

The etch block layer 314 can be formed of a transparent conductive material that has an etch selectivity with respect to a material that constitutes the capacitor upper electrode 315. The reason for having etch selectivity lies in that when the etch block layer 314 is formed and then patterning is performed thereon to form the capacitor upper electrode 315, the etch block layer 314 needs to be protected from damage. The reason for using a transparent conductive material lies in that when the etch block layer 314 and the capacitor upper electrode 315 are formed and then the capacitor lower electrode 312 and the interconnection line 312a are doped with ion impurities, only when the etch block layer 314 and the capacitor upper electrode 315 are transparent, the capacitor lower electrode 312 and the interconnection line 312a are able to be completely doped.

For example, in some embodiments, the capacitor upper electrode 315 may be formed of an amorphous indium tin oxide (a-ITO), and the etch block layer 314 may be formed of a crystalloid indium tin oxide (p-ITO). An etching speed of the crystalloid ITO (p-ITO) may be equal to or smaller than about a tenth of that of the amorphous ITO (a-ITO). The etching speed of the crystalloid ITO (p-ITO) may be decreased with respect to, in addition to a mixed aqueous solution of a hydrochloric acid (HCl) and a nitric acid ($HNO_3$) as an etchant that is used to wet-etch ITO, an aqueous solution of a hydrofluoric acid (HF), a nitric acid ($HNO_3$), or an acetic acid (CHCHOOH). The etch block layer 314 formed of the crystalloid ITO (p-ITO) may be used as an etching stopper during an etching process.

Referring back to FIG. 1, the light emission region 100 includes the organic light-emitting device OLED. The organic light-emitting device OLED includes a pixel electrode 115 that is electrically connected to any one of the source and drain electrodes 218s and 218d of the driving thin film transistor TFT, an opposite electrode 119 disposed corresponding to the pixel electrode 115, and an intermediate layer 118 interposed between the pixel electrode 115 and the opposite electrode 119. The pixel electrode 115 may be formed of the same transparent conductive material as in the gate lower electrode 215 at the same level. The opposite electrode 119 may be a light reflection electrode. The intermediate layer 118 may include an organic emissive layer. The organic light-emitting display device 1 of FIG. 1 is a bottom emission type organic light-emitting display device in which light is emitted toward a substrate 10.

In some embodiments, the organic light-emitting device OLED may have various thicknesses according to sub-pixels emitting different colored light. For example, if the organic light-emitting device OLED is included in a sub-pixel that emits red light, the organic light-emitting device OLED may have the greatest thickness; and if the organic light-emitting device OLED is included in a sub-pixel that emits blue light, the organic light-emitting device OLED may have the smallest thickness. Red light has the longest wavelength. Accordingly, by forming the organic light-emitting device OLED to have a relatively great thickness corresponding to the wavelength, light efficiency may be improved due to a resonance effect. Likewise, since blue light has the shortest wavelength, by forming the organic light-emitting device OLED to have a relatively small thickness corresponding to the wavelength, light efficiency may be improved due to a resonance effect. The wavelength and the thickness of the organic light-emitting device OLED are relative concepts. Compared to light from the green and blue sub-pixels, light emitted from the red sub-pixel has a relatively longer wavelength and the corresponding organic light-emitting device OLED also has a relatively greater thickness.

In some embodiments, a first auxiliary layer 114 is interposed between the first insulating layer 13 and the pixel electrode 115, and is formed of the same material as in the etch block layer 314 at the same level. Due to the first auxiliary layer 114, the thickness of the organic light-emitting device OLED varies according to a sub-pixel. From this structure, the organic light-emitting display device 1 with improved light efficiency is obtainable without use of an additional process.

Hereinafter, organic light-emitting devices EL included in red, green, and blue sub-pixels will now be described in detail.

Figure 5A:
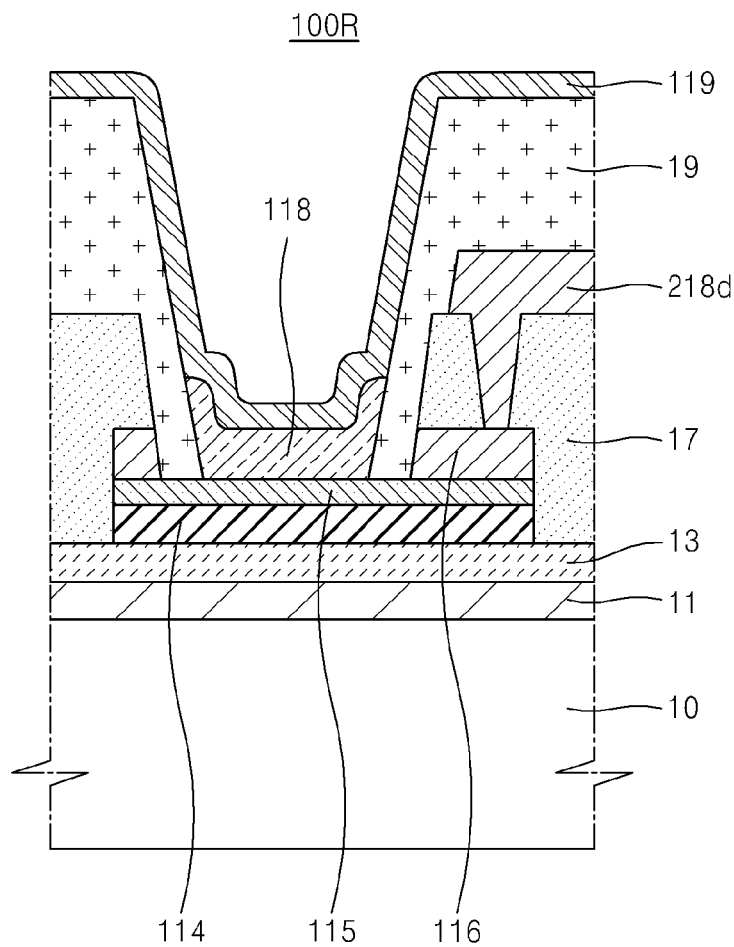
FIGS. 5A and 5B illustrate detailed cross-sectional views of a light emission region of the embodiment of an organic light-emitting display device of FIG. 1 and an intermediate layer thereof.
Figure 5B:
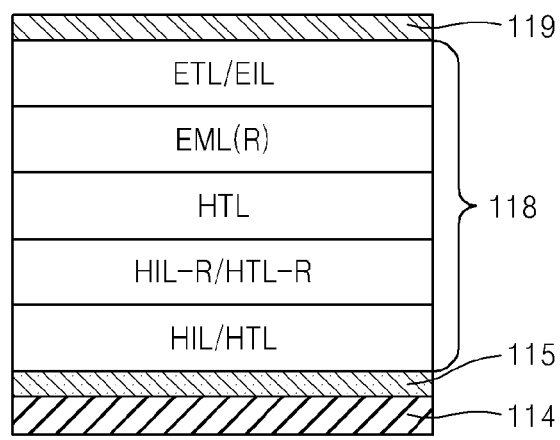

FIGS. 5A and 5B illustrate detailed cross-sectional views of a light emission region 100R of the embodiment of an organic light-emitting display device 1 of FIG. 1 and the intermediate layer 118 thereof. The light emission region 100R illustrated in FIGS. 5A and 5B is a light emission region of a red sub-pixel.

Referring to FIGS. 5A and 5B, the organic light-emitting device OLED of the red sub-pixel includes the first auxiliary layer 114 formed on the first insulating layer 13 on which the etch block layer 314 is formed, the pixel electrode 115 formed on the first auxiliary layer 114, the opposite electrode 119 facing the pixel electrode 115, and the intermediate layer 118 interposed between the pixel electrode 115 and the opposite electrode 119.

The first auxiliary layer 114 and the etch block layer 314 are formed simultaneously. Accordingly, the first auxiliary layer 114 can be formed of the same crystalloid ITO (p-ITO) used in the etch block layer 314 at the same level. The first auxiliary layer 114 enables the organic light-emitting device OLED to have a thickness corresponding to the wavelength of red light so as to resonate the red light, thereby improving light efficiency of the organic light-emitting device OLED.

Also, the intermediate layer 118 of a red sub-pixel may include a red organic emissive layer (EML) EML R, and at least one function layer selected from the group consisting of a hole transport layer (HTL), a hole injection layer (HIL), an electron transport layer (ETL), and an electron injection layer (EIL), each of which may have a single layer structure or a composite structure.

Also, since the red light has the longest wavelength, additional auxiliary layers HIL-R and HTL-R are further needed in addition to the first auxiliary layer 114 to adjust the thickness of the organic light-emitting device OLED to correspond to the wavelength. The additional auxiliary layers HIL-R and HTL-R may be disposed between the pixel electrode 115 and the red organic EML EML(R). The additional auxiliary layers HIL-R and HTL-R may be formed of the same material used in the HIL or the HTL, thereby allowing holes injected or transported from the pixel electrode 115 to pass to the red organic EML, EML(R). In the red sub-pixel, the thickness of the organic light-emitting device OLED is dependent upon the total thickness of the first auxiliary layer 114 and the additional auxiliary layers HIL-R and HTL-R.

Figure 6A:
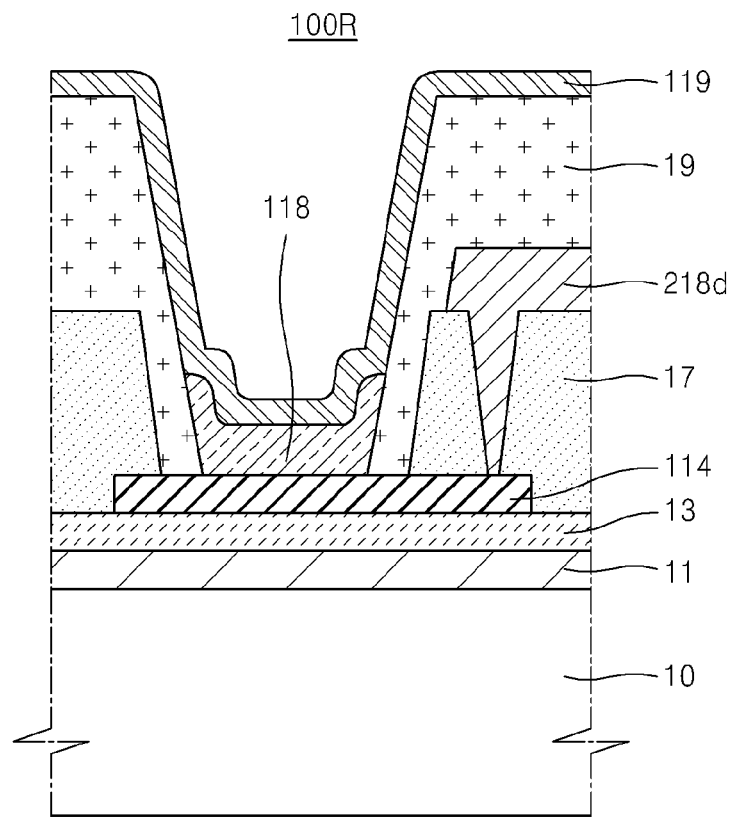
FIGS. 6A and 6B illustrate detailed cross-sectional views of a light emission region of a light emission region of a red sub-pixel according to another embodiment.
Figure 6B:
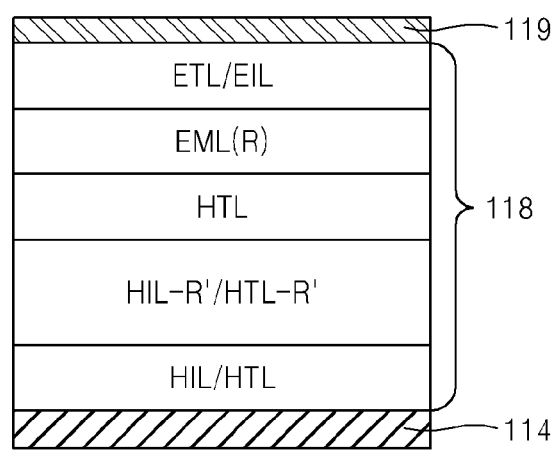

FIGS. 6A and 6B are a view of a light emission region 100R of a red sub-pixel according to another embodiment.

Referring to FIGS. 6A and 6B, unlike the light emission region 100R of FIGS. 5A and 5B, a pixel electrode is not formed on a first auxiliary layer. The organic light-emitting device OLED of FIGS. 6A and 6B includes the first auxiliary layer 114 that functions as the pixel electrode 115 and adjusts the wavelength of light, the opposite electrode 119 facing the first auxiliary layer 114, and the intermediate layer 118 interposed between the first auxiliary layer 114 and the opposite electrode 119.

Also, the intermediate layer 118 illustrated in FIGS. 6A and 6B includes additional auxiliary layers HIL-R' and HTL-R', and the total thickness of the additional auxiliary layers HIL-R' and HTL-R' in FIGS. 6A and 6B is equal to the total thickness of the additional auxiliary layers HIL-R and HTL-R and the pixel electrode 115 illustrated in FIGS. 5A and 5B. That is, in the organic light-emitting device OLED illustrated in FIGS. 6A and 6B, the first auxiliary layer 114 functions as the pixel electrode 115, and the additional auxiliary layers HIL-R' and HTL-R' adjust the thickness of the organic light-emitting device OLED to correspond to the wavelength of red light. As described above, the thickness of the organic light-emitting device OLED is controllable by using various methods.

Figure 7A:
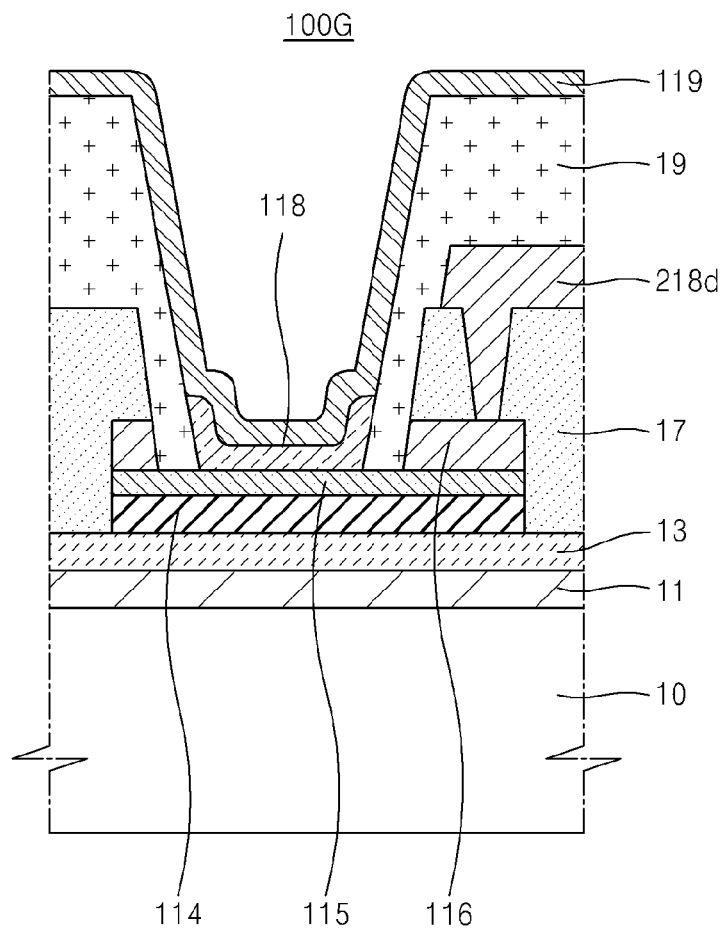
FIGS. 7A and 7B illustrate detailed cross-sectional views of a light emission region of a green sub-pixel and an intermediate layer thereof, according to an embodiment.
Figure 7B:
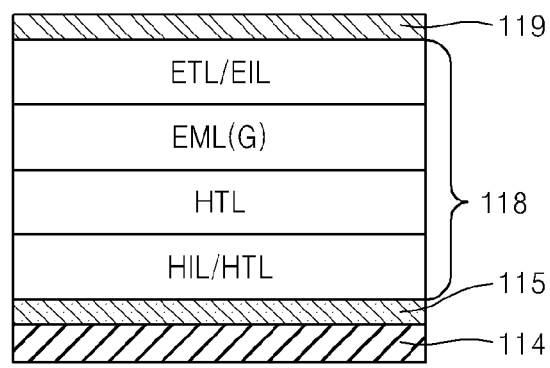

FIGS. 7A and 7B illustrate detailed cross-sectional views of a light emission region 100G for a green sub-pixel and the intermediate layer 118 thereof, according to an embodiment.

Referring to FIGS. 7A and 7B, an organic light-emitting device OLED of the green sub-pixel, like the organic light-emitting device OLED of the red sub-pixel illustrated in FIGS. 5A and 5B, includes a second auxiliary layer 114 formed on the first insulating layer 13, the pixel electrode 115 formed on the second auxiliary layer 114, and the intermediate layer 118 interposed between the pixel electrode 115 and the opposite electrode 119 facing the pixel electrode 115. Also, the thickness of the second auxiliary layer 114 is less than the total thickness of the first auxiliary layer 114 and the additional auxiliary layers HIL-R and HTL-R illustrated in FIGS. 5A and 5B.

The second auxiliary layer 114 and the etch block layer 314 are formed simultaneously, and accordingly, the second auxiliary layer 114 may be formed of the same crystalloid ITO (p-ITO) used in the etch block layer 314 at the same level. The second auxiliary layer 114 enables the organic light-emitting device OLED to have a thickness corresponding to the wavelength of green light so as to resonate the green light, thereby improving light efficiency of the organic light-emitting device OLED.

Also, the intermediate layer 118 of a green sub-pixel may include a green organic EML, EML(G), and at least one function layer selected from the group consisting of an HTL, an HIL, an ETL, and an EIL, each of which may have a single layer structure or a composite structure.

Figure 8A:
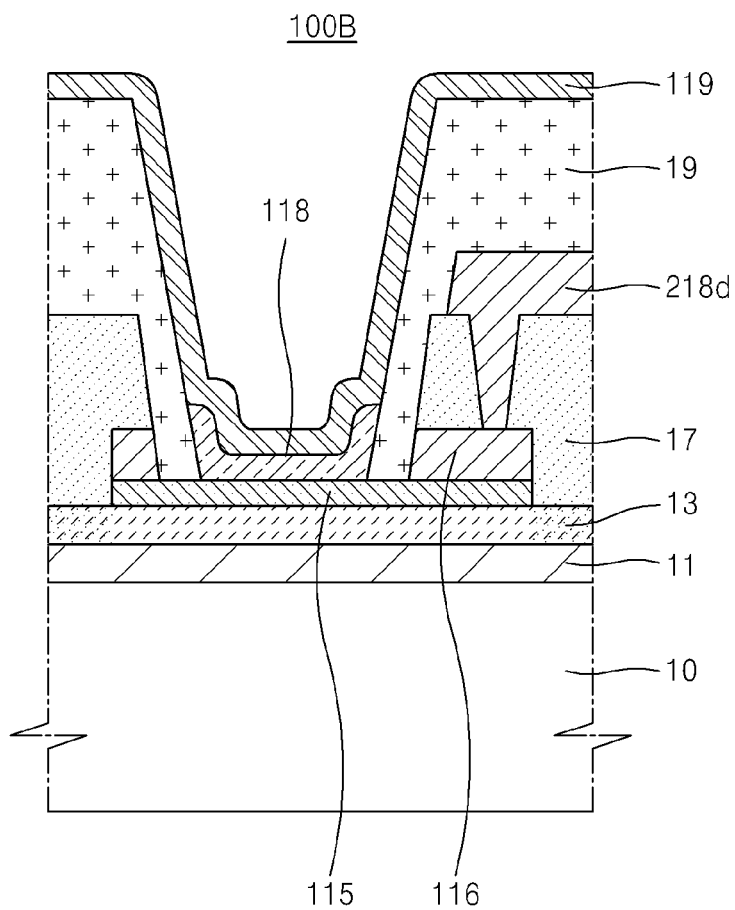
FIGS. 8A and 8B illustrate detailed cross-sectional views of a light emission region of a blue sub-pixel and an intermediate layer thereof, according to an embodiment.
Figure 8B:
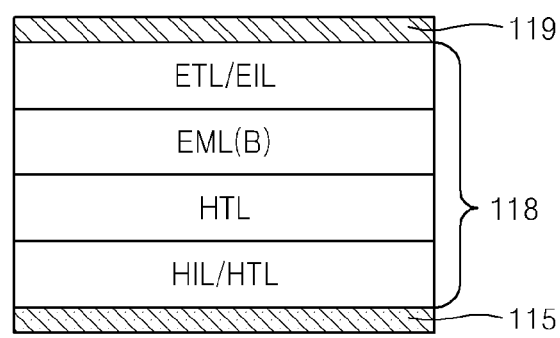

FIGS. 8A and 8B illustrate detailed cross-sectional views of a light emission region 100B of a blue sub-pixel and the intermediate layer 118 thereof, according to an embodiment.

Referring to FIGS. 8A and 8B, an organic light-emitting device OLED of the blue sub-pixel does not include an auxiliary layer, and includes the pixel electrode 115 formed on the first insulating layer 13, the opposite electrode 119 facing the pixel electrode 115, and the intermediate layer 118 interposed between the pixel electrode 115 and the opposite electrode 119. Since the blue light has the shortest wavelength among red, green and blue lights, to manufacture an organic light-emitting device OLED having the smallest thicknesses, the auxiliary layer is not included.

Also, the intermediate layer 118 for a blue sub-pixel may include a blue organic EML, EML(B), and at least one functional layer selected from the group consisting of an HTL, an HIL, an ETL, and an EIL, each of which may have a single layer structure or a composite structure.

FIGS. 9 through 14 are schematic cross-sectional views illustrating an embodiment of a method of manufacturing the organic light-emitting display device 1 of FIG. 1. Hereinafter, a method of manufacturing the red and green sub-pixels of FIGS. 5A, 5B, 7A and 7B will be described in detail.

Figure 9:
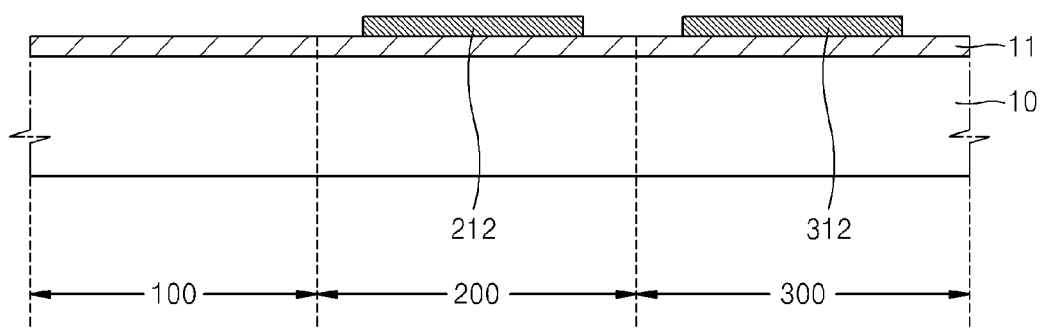
FIGS. 9-14 are schematic cross-sectional views illustrating an embodiment of a method of manufacturing the embodiment of an organic light-emitting display device of FIG. 1.

As illustrated in FIG. 9, a buffer layer 11 is formed on the substrate 10. The substrate 10 can be formed of a transparent glass material that mainly consists of $SiO_2$. In other embodiments, a transparent plastic material or metallic material can be used to form the substrate 10.

The buffer layer 11 formed on the substrate 10 prevents dispersion of impurity ions, prevents permeation of water molecules or an external gas, and provides surface flatness, and can include at least one of a barrier layer, and a blocking layer. The buffer layer 11 may be formed by depositing at least one of $SiO_2$ and $SiN_x$ by using various methods including plasma-enhanced chemical vapor deposition (PECVD), atmospheric pressure CVD (APCVD), low pressure CVD (LPCVD), and the like.

Then, the active layer 212 of the thin film transistor TFT and the capacitor lower electrode 312 are formed on the buffer layer 11. An amorphous silicon layer (not shown) is deposited on the buffer layer 11 and then crystallized to form a polycrystalloid silicon layer (not shown). Crystallizing the amorphous silicon may be performed by using various methods including, for example, rapid thermal annealing (RTA), solid phase crystallization (SPC), excimer laser annealing (ELA), metal-induced crystallization (MIC), metal-induced lateral crystallization (MILC), and sequential lateral solidification (SLS).

Then, the polycrystalloid silicon layer is patterned into the active layer 212 of the thin film transistor TFT and the capacitor lower electrode 312 by performing a mask process using a first mask (not shown).

In this mask process, light exposure may be performed using an exposure device (not shown) via a first photomask (not shown), followed by developing, etching, and stripping or ashing.

Although not illustrated in FIG. 9, as illustrated in FIG. 2, the polycrystalloid silicon layer is patterned using a mask process using a first mask (not shown) to form the interconnection line 312a connected to the capacitor lower electrode 312 simultaneously with the active layer 212 of the thin film transistor TFT and the capacitor lower electrode 312.

Figure 10:
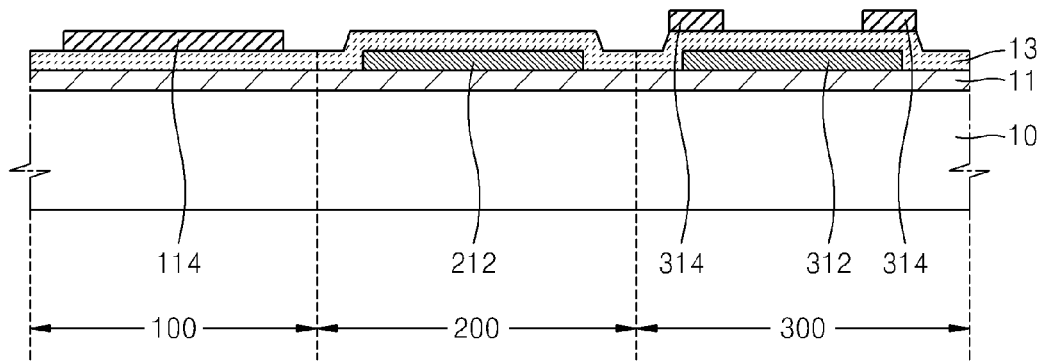

Then, as illustrated in FIG. 10, the first insulating layer 13 and a first transparent conductive material layer (not shown) are sequentially formed on the whole surface of the substrate 10 on which the active layer 212 and the capacitor lower electrode 312 are formed.

The first insulating layer 13 may be formed by depositing an inorganic material, such as $SiN_x$ or $SiO_x$, by, for example, PECVD, APCVD, or LPCVD. The first insulating layer 13 is interposed between the active layer 212 of the thin film transistor TFT and the gate electrode 210 and functions as a gate insulating layer of the thin film transistor TFT. Also, the first insulating layer 13 is interposed between the capacitor upper electrode 315 and the capacitor lower electrode 312 and functions as a dielectric layer of the capacitor Cst.

The first transparent conductive material layer may include amorphous ITO or crystalloid ITO. In a subsequent process, the first transparent conductive material layer may be patterned into the etch block layer 314 and/or the first auxiliary layer 114. In some embodiments, the organic light-emitting display device 1 according is a bottom emission type organic light-emitting display device in which light is emitted toward the substrate 10. Accordingly, the first auxiliary layer 114 disposed under the pixel electrode 115 is formed of a transparent conductive material. Also, in a subsequent process, the capacitor lower electrode 312 under the etch block layer 314 and the interconnection line 312a are doped with ion impurities. Accordingly, the etch block layer 314 is formed of a transparent material.

As illustrated in FIG. 10, in the storage region 300, the etch block layer 314 is formed, and in the light emission region 100, the first auxiliary layer 114 is formed.

The first transparent conductive material layer sequentially deposited on the whole surface of the substrate 10 may be patterned using a mask process using a second mask (not shown).

The etch block layer 314, as illustrated in FIG. 2, may be disposed corresponding to the connection portion 312b connecting the capacitor lower electrode 312 to the interconnection line 312a. Also, as illustrated in FIG. 4, the etch block layer 314 may be disposed corresponding to, in addition to the connection portion 312b, the gap G1 that is to be formed later, and may be formed as a closed loop covering all the connection portion 312b and the gap G1. Due to this structure of the etch block layer 314, the etch block layer 314 prevents over-etching of at least a portion of the first insulating layer 13 corresponding to the connection portion 312b.

The first auxiliary layer 114 may be formed corresponding to the pixel electrode 115 that is formed later. By doing so, the thickness of the organic light-emitting device OLED is adjustable corresponding to the wavelength of light emitted by the EML.

Also, if the first transparent conductive material layer is formed of an amorphous ITO (a-ITO), the etch block layer 314 and the first auxiliary layer 114 are patterned and annealing is performed thereon to convert the amorphous ITO (a-ITO) into crystalloid ITO (p-ITO). In some embodiments, the annealing may be performed using heat, ultraviolet (UV) light, or a laser. Also, even when a separate annealing treatment is not performed, the amorphous ITO (a-ITO) that constitutes the etch block layer 314 and the first auxiliary layer 114 can be crystallized through a heat treatment or a UV treatment during a process. Also, the annealing may be performed before the first transparent conductive material layer is patterned into the etch block layer 314 and the first auxiliary layer 114.

Then, a second transparent conductive material layer (not shown) and a first metal layer (not shown) are sequentially formed on the whole surface of the substrate 10 on which the etch block layer 314 and the first auxiliary layer 114 are formed.

The second transparent conductive material layer can include at least one transparent material selected from the group consisting of indium tin oxide (ITO), indium zinc oxide (IZO), zinc oxide (ZnO), indium oxide ($In_2O_3$), indium gallium oxide (IGO), and aluminum zinc oxide (AZO). In some embodiments, the second transparent conductive material layer may include amorphous ITO (a-ITO) having etch selectivity with respect to the crystalloid ITO (p-ITO). In a subsequent process, the second transparent conductive material layer may be patterned into the pixel electrode 115, the gate lower electrode 215, and the capacitor upper electrode 315.

In bottom emission type organic light-emitting display device embodiments, the pixel electrode 115 is formed as a transparent electrode. Accordingly, the second transparent conductive material layer for forming the pixel electrode 115 is formed of a transparent conductive oxide (TCO).

The first metal layer may include at least one material selected from the group consisting of aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and copper (Cu). In some embodiments, the second metal layer may have a three-layer structure including Mo, Al, and Mo layers. In a subsequent process, the second conductive layer may be patterned into a gate upper electrode 216.

According to some embodiments, since the gate electrode 210 needs to conduct a current efficiently, if only the second transparent conductive material layer having a relatively high resistance is formed, a smooth current flow may not be obtained. Accordingly, to make the thin film transistor TFT to perform its due function sufficiently, the first metal layer formed of a metallic material having a lower resistance than that of the second transparent conductive material layer is formed.

Figure 11:
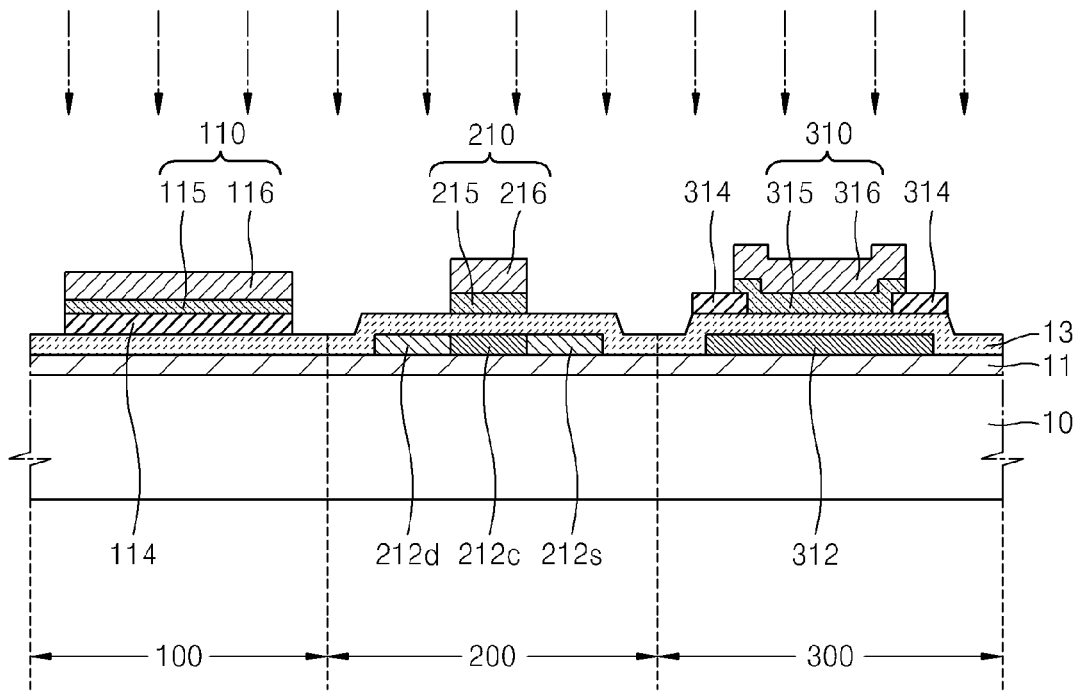

Then, as illustrated in FIG. 11, a pixel electrode pattern 110, the gate electrode 210, and a capacitor upper electrode pattern 310 are formed on the substrate 10.

The second transparent conductive material layer and the first metal layer sequentially deposited on the whole surface of the substrate 10 are patterned by using a mask process using a third mask (not shown).

In the thin film transistor region 200, the gate electrode 210 is formed on the active layer 212. The gate electrode 210 includes the gate lower electrode 215 that constitutes a portion of the second transparent conductive material layer and the gate upper electrode 216 that constitutes a portion of the first metal layer.

Since the etch block layer 314 and the first auxiliary layer 114 are formed of a material having etch selectivity with respect to the second transparent conductive material layer, when the second transparent conductive material layer is patterned, the etch block layer 314 and the first auxiliary layer 114 may not be damaged.

In some embodiments, the gate electrode 210 is formed corresponding to a center of the active layer 212, and the active layer 212 is doped with a n-type or p-type impurity by using the gate electrode 210 as a self align mask, thereby forming the source and drain regions 212s and 212d on edges of the active layer 212 on opposite sides of the gate electrode 210, and the channel region 212c disposed between the source and drain regions 212s and 212d. In some embodiments, the impurity may be, typically, a boron (B) ion or a phosphorous (P) ion.

In the storage region 300, the capacitor upper electrode pattern 310 for forming the capacitor upper electrode 315 is formed on the etch block layer 314 corresponding to the capacitor lower electrode 312, and in the light emission region 100, the pixel electrode pattern 110 for forming the pixel electrode 115 is formed on the first auxiliary layer 114.

The capacitor lower electrode 312 formed of the same material used in the active layer 212 is not doped like the channel region 212c, since the first metal layer of the capacitor upper electrode pattern 310 functions as a blocking mask. In some embodiments, ion impurities are doped on the interconnection line 312a of the capacitor on which the first metal layer of the capacitor upper electrode pattern 310 is not disposed.

Then, the second insulating layer 17 is deposited on the whole surface of the substrate 10 on which the gate electrode 210, the capacitor upper electrode pattern 310, and the pixel electrode pattern 110 are formed.

The second insulating layer 17 may be formed by spin coating at least one organic insulating material selected from the group consisting of polyimide, polyamide, acryl resin, benzocyclobutene, and phenol resin. The second insulating layer 17 has a sufficient thickness, such as, for example, a thickness that is greater than that of the first insulating layer 13, and functions as an interlayer insulating layer between the gate electrode 210 of the thin film transistor TFT and the source and drain electrodes 218s and 218d. Also, the second insulating layer 17 can be formed of an inorganic insulating material that is used in the first insulating layer 13, in addition to the organic insulating materials described above. Alternatively, the second insulating layer 17 can be formed by alternately depositing an organic insulating material and an inorganic insulating material.

Figure 12:
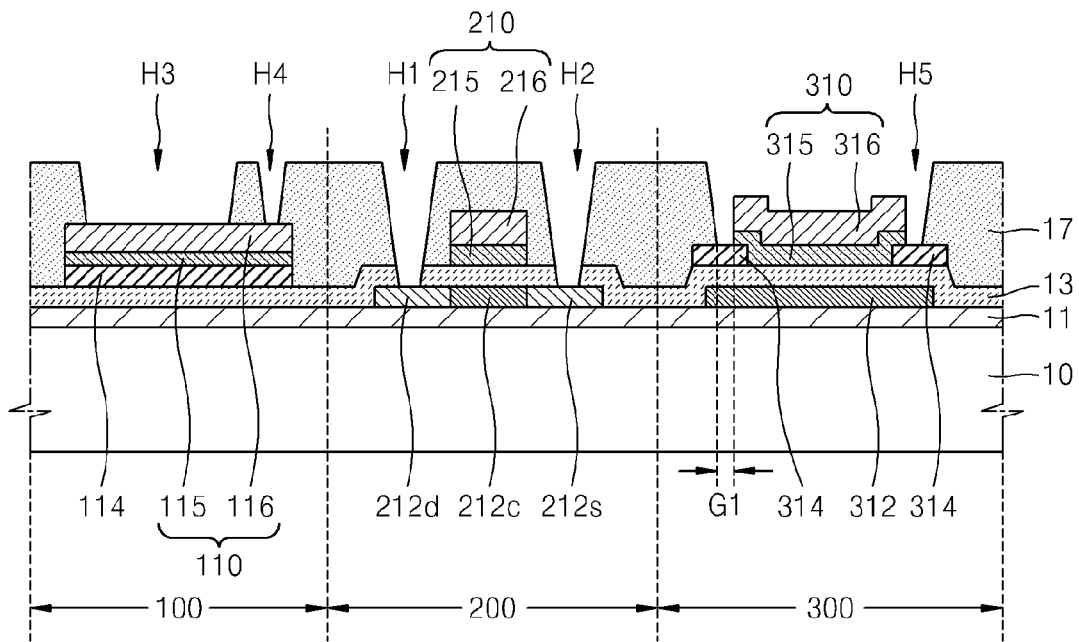

Then, as illustrated in FIG. 12, the second insulating layer 17 is patterned to form first and second contact holes H1 and H2 exposing portions of the source and drain regions 212s and 212d of the active layer 212 and third, fourth, and fifth openings H3, H4, and H5 exposing the capacitor upper electrode pattern 310 and a portion of the pixel electrode pattern 110 therein.

In detail, the first and second contact holes H1 and H2 and the third, fourth, and fifth openings H3, H4, and H5 are formed by patterning the first insulating layer 13 and/or the second insulating layer 17 by performing a mask process using a fourth mask (not shown). Herein, the first and second contact holes H1 and H2 expose portions of the source and drain regions 212s and 212d, and the third opening H3 and the fourth opening H4 expose at least a portion of the first metal layer that constitutes an upper portion of the pixel electrode pattern 110. The fifth opening H5 completely exposes the capacitor upper electrode pattern 310.

The fifth opening H5 is formed completely exposing the capacitor upper electrode pattern 310, and in this case, the gap G1 is formed between the side of the capacitor upper electrode pattern 310 and the inner wall of the fifth opening H5. As described above, since the capacitor upper electrode pattern 310 is completely exposed such that the gap G1 is able to be formed, the first metal layer included in the capacitor upper electrode pattern 310 is completely removed and the capacitor lower electrode 312 may be completely doped with ion impurities. Also, the gap G1 may be formed corresponding to the connection portion 312b of the capacitor lower electrode 312 and the interconnection line 312a.

As described above, since the etch block layer 314 is disposed corresponding to the connection portion 312b, when the fifth opening H5 is formed by etching the second insulating layer 17, the first insulating layer 13 disposed under the second insulating layer 17 is not affected.

Then, a second metal layer (not shown) is deposited on the whole surface of the substrate 10, covering the second insulating layer 17.

The second metal layer may be formed of the conductive materials used to form the first metal layer. The material for forming the second metal layer is not be limited thereto and various other conductive materials may also be used to form the second metal layer. Also, the second metal layer may have a thickness that is sufficient to fill the first and second contact holes H1 and H2 and the third, fourth, and fifth openings H3, H4, and H5.

Figure 13:
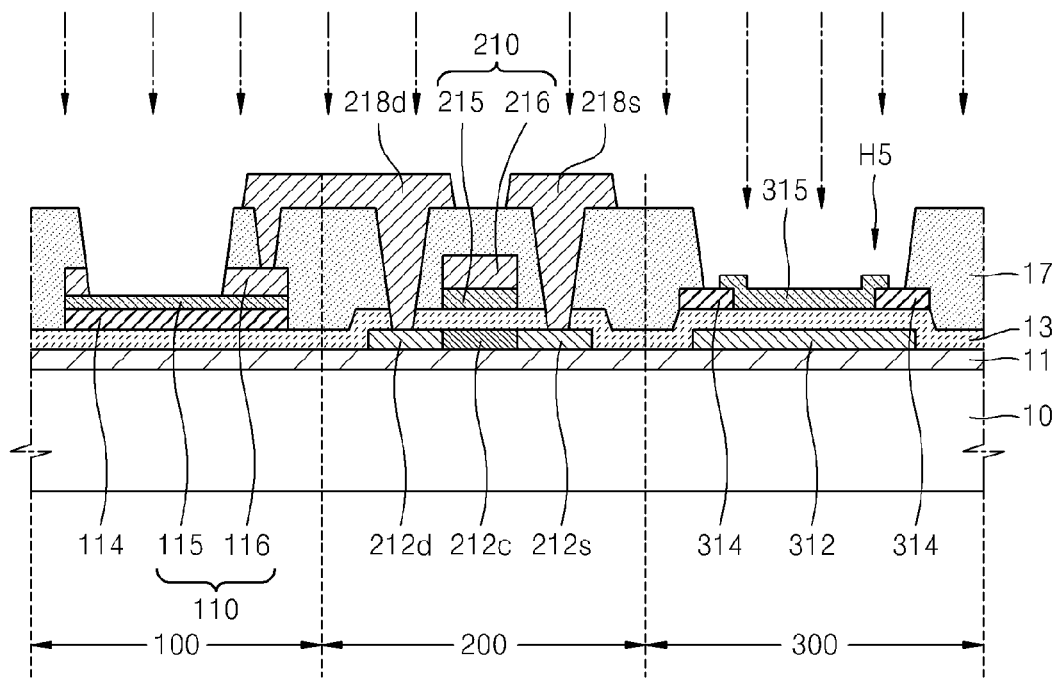

Then, as illustrated in FIG. 13, the second metal layer is patterned to form the source and drain electrodes 218s and 218d, the pixel electrode 115, and the capacitor upper electrode 315.

The second metal layer is patterned by performing a mask process using a fifth mask (not shown) to form the source and drain electrodes 218s and 218d.

In some embodiments, any one the source and drain electrodes 218s and 218d (for example, the drain electrode 218d) is formed to be connected to the pixel electrode 115 via the fourth opening H4 at an edge of the upper portion of the pixel electrode pattern 110 corresponding to the first metal layer, wherein the pixel electrode pattern 110 is to be the pixel electrode 115.

If the second metal layer that constitutes the source and drain electrodes 218s and 218d and the first metal layer of the pixel electrode pattern 110 (that is 116 in FIG. 13) are formed of the same material, the source and drain electrodes 218s and 218d and the pixel electrode 115 may be formed simultaneously. However, if the second metal layer and the first metal layer are formed of different materials, the source and drain electrodes 218s and 218d are formed and then the pixel electrode 115 is formed by additional etching. The pixel electrode 115 is formed by removing the first metal layer of the pixel electrode pattern 110 (that is 116) exposed by the third opening H3. In some embodiments, the capacitor upper electrode 315 is formed by removing the exposed upper portion of the capacitor upper electrode pattern 310 corresponding to the first metal layer. Accordingly, the gate lower electrode 215, the capacitor upper electrode 315, and the pixel electrode 115 are formed of the same material at the same level.

In some embodiments, since the upper portion of the capacitor upper electrode pattern 310 corresponding to the first metal layer is completely removed, the capacitor lower electrode 312 may be completely doped by implanting an n-type or p-type impurity via the fifth opening H5. The impurity implanted during the doping may be the B or P ion used in doping the active layer 212, and other impurities may also be used for the doping.

In some embodiments, the fifth opening H5 completely exposes the capacitor upper electrode pattern 310, and the etch block layer 314 is formed of a transparent conductive material. Accordingly, the interconnection line 312a connected to the capacitor lower electrode 312, and the connection portion 312b may each be doped with ion impurities. Since the capacitor lower electrode 312 and the interconnection line 312a do not have any non-ion doped region, an electrostatic capacity increases and a signal transmittance quality increases.

Figure 14:
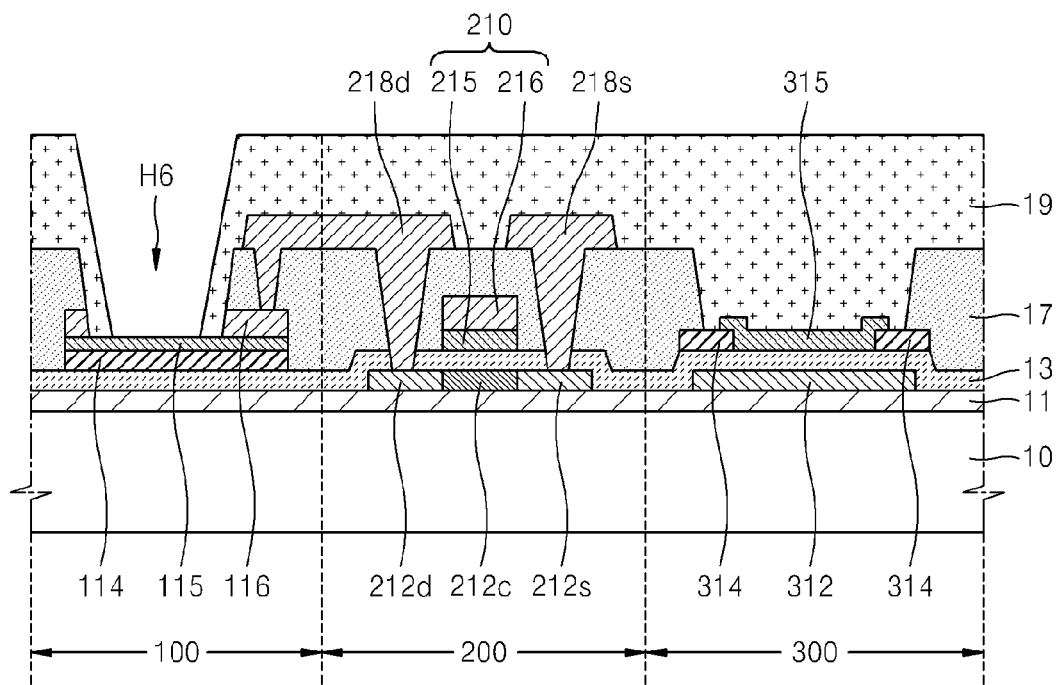

Then, as illustrated in FIG. 14, a pixel-defining layer (PDL) 19 is formed on the substrate 10.

The third insulating layer 19 is deposited on the whole surface of the substrate 10 on which the pixel electrode 115, the source and drain electrodes 218s and 218d, and the capacitor upper electrode 315 are formed.

The third insulating layer 19 may be formed by spin coating at least one organic insulating material selected from the group consisting of polyimide, polyamide, acryl resin, benzocyclobutene, and phenol resin. The third insulating layer 19 may instead be formed of an inorganic insulating material selected from the group consisting of $SiO_2$, $SiN_x$, $Al_2O_3$, $CuOx$, $Tb_4O_7$, $Y_2O_3$, $Nb_2O_5$, and $Pr_2O_3$, in addition to the organic insulating materials described above. In other embodiments, the third insulating layer 19 may have a multi-layer structure in which an organic insulating material and an inorganic insulating material are alternately deposited.

The third insulating layer 19 is patterned by performing a mask process using a sixth mask (not shown) to form a sixth opening H6 exposing a central portion of the pixel electrode 115, thereby defining a pixel.

The third insulating layer 19 may fill the gap G1. In some embodiments, if the third insulating layer 19 is formed of an organic insulating material, by appropriately filling the gap G1 with the organic insulating material, a short that may occur between the capacitor lower electrode 312 and the etch block layer 314 contacting the capacitor upper electrode 315 is preventable.

Then, as illustrated in FIG. 1, the intermediate layer 118 including the organic EML and the opposite electrode 119 are formed in the sixth opening H6 exposing the pixel electrode 115. In a red sub-pixel, the intermediate layer 118 may include the organic EML, EML (R), and at least one function layer selected from the group consisting of an HTL, an HIL, an ETL, and an EIL, each of which may have a single layer structure or a composite structure, and additional auxiliary layers can further be formed.

The organic EML, EML (R) for emitting red light can include as a host material carbazole biphenyl (CBP) or mCP, and as a dopant material, at least one phosphorescent material selected from the group consisting of PIQIr(acac)(bis(1-phenylisoquinoline)acetylacetonate iridium), PQIr(acac(bis(1-phenylquinoline)acetylacetonate iridium), PQIr(tris(1-phenylquinoline) iridium), and PtPEP(octaethylporphyrin platinum). Also, the organic EML EML (R) for emitting red light may instead be formed of a fluorescent material, such as PED:Eu(DBM)3(Phen) or perylene.

The HTL can be formed of N,N'-Di naphthalene-1-yl-N, N'-diphenyl-benzidine (NPB), or PEDOT. The HIL may be formed of copper phthalocyanine (CuPc), or 4,4',4"-tris(N-(3-methylphenyl)-N-phenylamino)triphenylamine (MT-DATA).

The additional auxiliary layers HIL-R and HTL-R can be disposed between the pixel electrode 115 and the red organic EML EML(R), and may be formed of the same material used in the HTL or the HIL. Accordingly, the additional auxiliary layers HIL-R and HTL-R may be layers that allow holes injected or transported from the pixel electrode 115 to pass to the red organic EML, EML(R).

The ETL can be formed of a polycyclic hydro carbonaceous derivative, a heterocyclic compound, or a tris(8-quinolinolato)aluminum (Alq3). The EIL can be formed of LiF, Liq, NaF, or Naq.

The opposite electrode 119 can be formed on the whole surface of the substrate 10 to function as a common electrode. In some embodiments of the organic light-emitting display device, the pixel electrode 115 is used as an anode and the opposite electrode 119 is used as a cathode. The polarities of the pixel electrode 115 and the opposite electrode 119 may also be exchanged in other embodiments.

If the organic light-emitting display device is a bottom emission type organic light-emitting display device in which light is emitted toward the substrate 10, the pixel electrode 115 is a transparent electrode and the opposite electrode 119 is a reflective electrode. The reflective electrode may be formed by depositing a metal having a small work function, for example, depositing Ag, Mg, Al, Pt, Pd, Au, Ni, Nd, Ir, Cr, Li, Ca, LiF/Ca, LiF/Al, or a compound thereof in a small thickness.

During the respective mask processes for forming the organic light-emitting display device, the removal of the deposited layers can be performed by dry etch or wet etch.

Figure 15:
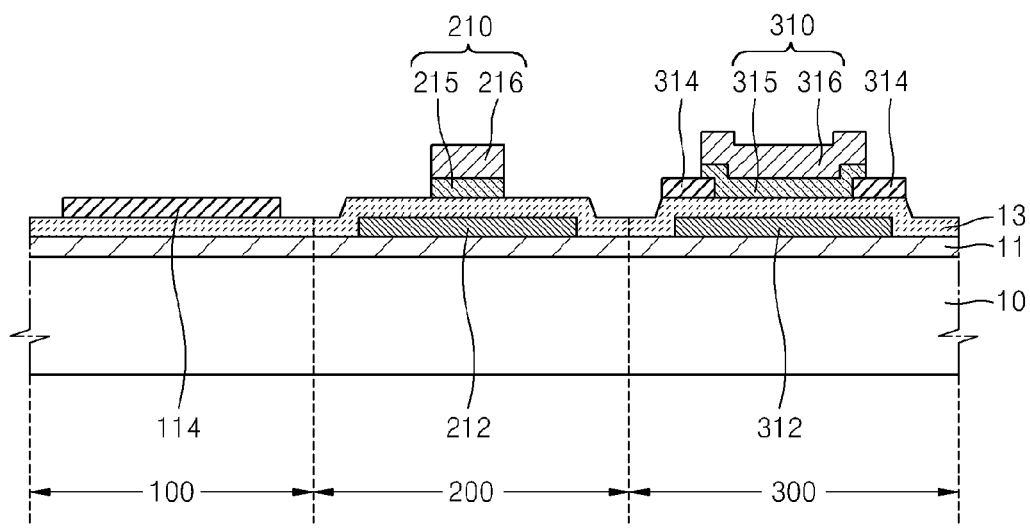
FIG. 15 is a schematic cross-sectional view illustrating a part of a method of manufacturing an organic light-emitting display device including a red sub-pixel illustrated in FIG. 6.

In the light emission region 100R of a red sub-pixel illustrated in FIGS. 6A and 6B, as illustrated in FIG. 15, the mask process using the third mask illustrated in FIG. 11 is performed except that the pixel electrode pattern 110 is not formed in the light emission region 100.

Accordingly, in the mask process using the fourth mask illustrated in FIG. 12, the second insulating layer 17 is formed on the first insulating layer 13, covering the gate electrode 210, and the capacitor upper electrode pattern 310, the contact holes H1 and H2 and the third, fourth, and fifth openings H3, H4, and H5, and in the mask process using the fifth mask illustrated in FIG. 13, the source and drain electrodes 218s and 218d are formed, and the first metal layer is removed from the capacitor upper electrode pattern 310 to form the capacitor upper electrode 315. Since the pixel electrode pattern 110 is not formed, the process related to the pixel electrode pattern 110 is not performed. Subsequent processes are performed in the same manner as described with reference to FIGS. 9 to 14 and thus, will not be described again.

Figure 16:
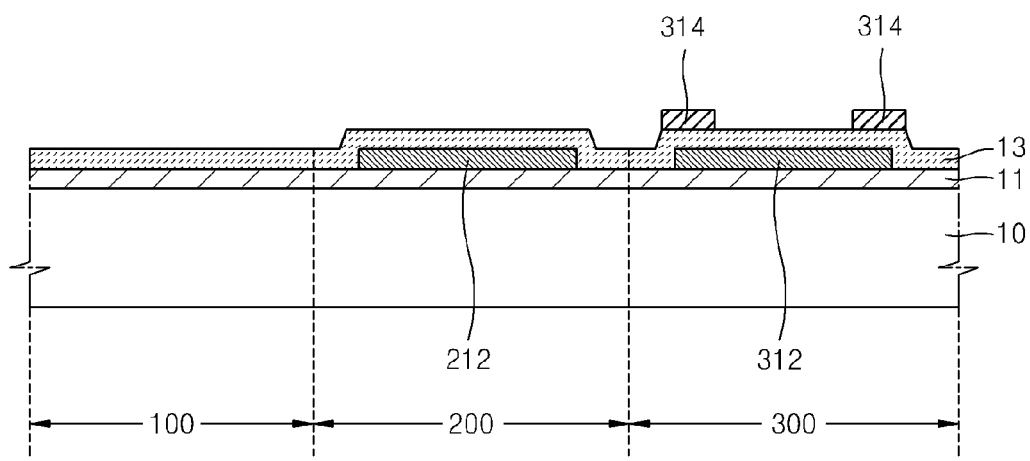
FIG. 16 is a schematic cross-sectional view illustrating a part of a method of manufacturing an organic light-emitting display device including a blue sub-pixel illustrated in FIGS. 8A and 8B.

In the light emission region 100B of a blue sub-pixel illustrated in FIG. 8, as illustrated in FIG. 16, the mask process using the second mask illustrated in FIG. 10 is performed except that the first auxiliary layer 114 is not formed in the light emission region 100. Subsequent processes are performed in the manner as described with reference to FIGS. 11 to 14 and thus, will not be described again.

The above embodiments have been described with reference to the organic light-emitting display device 1. However, the present invention is not limited thereto, and various other display devices, such as a liquid crystal display device, may also be used.

In the drawings used to describe certain embodiments, only one TFT and one capacitor are illustrated. However, the illustrated structures are only for ease of explanation, and the present invention is not limited thereto. As long as the number of mask processes is not increased, a plurality of TFTs and a plurality of capacitors may also be formed in the organic light-emitting display devices according to embodiments of the present invention According to an embodiment of the present invention described above, an organic light-emitting display device is manufactured by performing a total of six mask processes and thus, the manufacturing process thereof is simplified. Also, ion impurities not being doped on a capacitor lower electrode and an interconnection line is prevented, thereby increasing an electrostatic capacity and a signal transmittance quality of the interconnection line. Also, intermediate layers for pixels emitting different color light have different thicknesses and thus, light efficiency increases.

While the present invention has been particularly shown and described with reference to certain embodiments thereof, it will be understood by those of ordinary skill in the art that various changes in form and details may be made therein without departing from the spirit and scope of the present invention as defined by the following claims.

What is claimed is:

1. An organic light-emitting display device comprising:
    a capacitor lower electrode formed on a substrate, at the same level as an active layer of a thin film transistor, and comprising a semiconductor material doped with ion impurities;
    a first insulating layer formed on the substrate, covering the active layer and the capacitor lower electrode;
    a gate electrode of the thin film transistor formed on the first insulating layer and comprising a gate lower electrode formed of a transparent conductive material and a gate upper electrode formed of metal;
    a pixel electrode formed on the first insulating layer, electrically connected to the thin film transistor, and formed of a transparent conductive material;
    a capacitor upper electrode disposed at the same level as the pixel electrode and formed of a transparent conductive material;
    an etch block layer formed between the first insulating layer and the capacitor upper electrode and formed of a transparent conductive material;
    source and drain electrodes of the thin film transistor electrically connected to the active layer;
    a second insulating layer formed between the first insulating layer and the source and drain electrodes and having an opening completely exposing the capacitor upper electrode;
    a third insulating layer formed on the second insulating layer and exposing the pixel electrode; and
    an intermediate layer disposed on the pixel electrode and comprising an emissive layer; and
    an opposite electrode disposed facing the pixel electrode with the intermediate layer therebetween,
    wherein a gap is formed by the etch block layer between a side of the capacitor upper electrode and an inner wall of the opening.

2. The organic light-emitting display device of claim 1, wherein the capacitor lower electrode is at the same level as an interconnection line connected thereto, and the interconnection line and a connection portion connecting the capacitor lower electrode to the interconnection line comprise a semiconductor material doped with the ion impurities.

3. The organic light-emitting display device of claim 2, wherein the connection portion connecting the capacitor lower electrode to the interconnection line corresponds to the gap between the side of the capacitor upper electrode and an inner wall of the opening.

4. The organic light-emitting display device of claim 3, wherein the etch block layer is disposed corresponding to at least the connection portion.

5. The organic light-emitting display device of claim 1, wherein the gate lower electrode, the pixel electrode, and the capacitor upper electrode are formed of a second transparent conductive material, and the etch block layer is formed of a first transparent conductive material having etch selectivity with respect to the second transparent conductive material.

6. The organic light-emitting display device of claim 5, wherein the second transparent conductive material is an amorphous indium tin oxide (a-ITO), and the first transparent conductive material is crystalloid indium tin oxide (p-ITO).

7. The organic light-emitting display device of claim 1, wherein if the intermediate layer comprises a first emissive layer for emitting red light, the intermediate layer further comprises a first auxiliary layer between the first insulating layer and the first emissive layer.

8. The organic light-emitting display device of claim 7, wherein the first auxiliary layer comprises:
    a first layer disposed between the pixel electrode and the first emissive layer and allowing holes injected or transported from the pixel electrode to the first emissive layer to pass therethrough; and
    a second layer disposed between the first insulating layer and the pixel electrode, and formed of the same material used in the etch block layer at the same level.

9. The organic light-emitting display device of claim 7, wherein if the intermediate layer comprises a second emissive layer for emitting green light, the intermediate layer further comprises a second auxiliary layer having a thickness that is smaller than that of the first auxiliary layer between the first insulating layer and the second emissive layer.

10. The organic light-emitting display device of claim 9, wherein the second auxiliary layer comprises a layer that is interposed between the first insulating layer and the pixel electrode, and is formed of the same material used in the etch block layer at the same level.

11. The organic light-emitting display device of claim 1, wherein the intermediate layer comprises a third emissive layer for emitting blue light.

12. The organic light-emitting display device of claim 1, wherein the opposite electrode is a reflective electrode that reflects light emitted from the emissive layer.

13. The organic light-emitting display device of claim 1, wherein if the intermediate layer comprises a first emissive layer for emitting red light, the intermediate layer is interposed between the pixel electrode and the first emissive layer, and further comprises an auxiliary layer that allows holes injected or transported from the pixel electrode to the first emissive layer to pass therethrough, and the pixel electrode is formed of the same crystalloid indium tin oxide (p-ITO) as in the etch block layer at the same level.

* * * * *